(12) United States Patent
Zhou et al.

(10) Patent No.: US 10,283,038 B2
(45) Date of Patent: May 7, 2019

(54) SHIFT REGISTER UNIT AND METHOD FOR DRIVING THE SAME, GATE DRIVE CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Xiaoliang Zhou, Beijing (CN); Hongwei Wang, Beijing (CN); Fei Yu, Beijing (CN); Lei Jiang, Beijing (CN)

(73) Assignees: BOE TECHNOLOGY GROUP CO., LTD, Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 192 days.

(21) Appl. No.: 15/311,386

(22) PCT Filed: Nov. 4, 2015

(86) PCT No.: PCT/CN2015/093749
§ 371 (c)(1),
(2) Date: Nov. 15, 2016

(87) PCT Pub. No.: WO2016/206271
PCT Pub. Date: Dec. 29, 2016

(65) Prior Publication Data
US 2017/0178558 A1   Jun. 22, 2017

(30) Foreign Application Priority Data

Jun. 24, 2015 (CN) .......................... 2015 1 0354969

(51) Int. Cl.
*G11C 19/00* (2006.01)
*G09G 3/20* (2006.01)
*G11C 19/28* (2006.01)

(52) U.S. Cl.
CPC ............. *G09G 3/2092* (2013.01); *G09G 3/20* (2013.01); *G11C 19/28* (2013.01);
(Continued)

(58) Field of Classification Search
None
See application file for complete search history.

(56) References Cited

U.S. PATENT DOCUMENTS 9,865,214 B2 *  1/2018  Chen ..................... G09G 3/3677
9,886,921 B2 *  2/2018  Chen ..................... G09G 3/3611
(Continued)

FOREIGN PATENT DOCUMENTS

CN   1460981    12/2003
CN   1797083    7/2006
(Continued)

OTHER PUBLICATIONS

Written Opinion and International Search Report for PCT/CN2015/093749, English Translation of Written Opinion Attached to Original Document, Completed by the Chinese Patent Office, dated Jan. 28, 2016, All together 15 Pages.
(Continued)

*Primary Examiner* — Tuan T Lam
(74) *Attorney, Agent, or Firm* — Brooks Kushman P.C.

(57) ABSTRACT

A shift register unit and a method for driving the shift register unit, a gate drive circuit and a display device are provided. The shift register unit includes a driving signal generating module and a selecting module. The driving signal generating module generates a driving signal for driving n rows of gate lines to be turned on, a duration of the
(Continued)

driving signal being equal to a duration spent on scanning the n rows of gate lines, and n is equal to or greater than 2. The selecting module, connected to the driving signal generating module and input terminals of the n rows of gate lines, selects the n rows of gate lines sequentially and connects each selected gate line to the driving signal generating module, such that the driving signal is inputted to the n rows of gate lines sequentially.

11 Claims, 3 Drawing Sheets

(52) U.S. Cl.
CPC ............... *G09G 2300/0426* (2013.01); *G09G 2300/0814* (2013.01); *G09G 2310/0218* (2013.01); *G09G 2310/0286* (2013.01); *G09G 2310/08* (2013.01); *G09G 2330/04* (2013.01)

(56) References Cited

U.S. PATENT DOCUMENTS

| | | | | |
|---|---|---|---|---|
| 2006/0267909 | A1* | 11/2006 | Hsu | G09G 3/3677 345/100 |
| 2008/0192041 | A1 | 8/2008 | Ho et al. | |
| 2008/0316159 | A1* | 12/2008 | Qi | G09G 3/3677 345/92 |
| 2011/0058640 | A1* | 3/2011 | Shang | G11C 19/184 377/64 |
| 2011/0316833 | A1* | 12/2011 | Chang | G09G 3/3677 345/211 |
| 2014/0139414 | A1 | 5/2014 | Zhang | |
| 2014/0159997 | A1* | 6/2014 | Chen | G09G 3/3611 345/87 |
| 2015/0325181 | A1* | 11/2015 | Wang | G09G 3/3677 377/64 |
| 2016/0012764 | A1* | 1/2016 | Xu | G11C 19/28 345/204 |
| 2016/0027526 | A1* | 1/2016 | Xu | G11C 19/28 345/215 |
| 2016/0240158 | A1* | 8/2016 | Xu | G11C 19/28 |
| 2016/0258666 | A1* | 9/2016 | Guerra | F25D 3/06 |
| 2016/0300536 | A1* | 10/2016 | Li | G09G 3/344 |
| 2016/0351159 | A1* | 12/2016 | Yang | G09G 3/20 |
| 2017/0039968 | A1* | 2/2017 | Chen | G09G 3/3648 |
| 2017/0278473 | A1* | 9/2017 | Shang | G09G 3/36 |

FOREIGN PATENT DOCUMENTS

| | | |
|---|---|---|
| CN | 1877668 | 12/2006 |
| CN | 102881248 A | 1/2013 |
| CN | 103093825 | 5/2013 |
| CN | 103680451 | 3/2014 |
| CN | 104036714 | 9/2014 |
| CN | 104392704 | 3/2015 |
| CN | 104867439 | 8/2015 |
| KR | 100659712 | 12/2006 |

OTHER PUBLICATIONS

Chinese Office Action for Chinese Application No. 201510354969.3, English Translation attached to original document, Completed by the Chinese Patent Office, dated Jun. 3, 2016, All together 9 Pages.
Chinese Office Action for Chinese Application No. 201510354969.3, English Translation attached to original document, Completed by the Chinese Patent Office, dated Nov. 3, 2016, All together 8 Pages.
Supplementary Partial Search Report for European Application No. EP15891409, dated Sep. 28, 2018, 19 Pages.

* cited by examiner

SHIFT REGISTER UNIT AND METHOD FOR DRIVING THE SAME, GATE DRIVE CIRCUIT AND DISPLAY DEVICE

CROSS-REFERENCE TO RELATED APPLICATIONS

This application is the U.S. national phase of PCT Application No. PCT/CN2015/093749 filed on Nov. 4, 2015, which claims priority to Chinese Patent Application No. 201510354969.3 filed on Jun. 24, 2015, the disclosures of which are incorporated in their entirety by reference herein.

TECHNICAL FIELD

The present disclosure relates to the field of display technologies, and in particular, to a shift register unit and a method for driving the shift register unit, a gate drive circuit and a display device.

BACKGROUND

In recent years, displays tend to be highly-integrated and low-cost, since an important relevant technology, i.e., Gate Driver on Array (GOA) is used in mass production of displays. With the GOA, a gate drive circuit is integrated on an array substrate of a display panel, thus, a gate drive integrated circuit is no longer required, thereby reducing product costs both in the cost of materials and production processes.

For the GOA, the gate drive circuit includes several shift register units, each of which includes multiple thin film transistors (TFTs), where each shift register unit corresponds one row of gate line and is used to drive the corresponding row of gate line to be turned on or off.

However, since one shift register unit can only drive one row of gate line to be turned on or off, multiple shift register units need to be provided in the display panel for driving multiple rows of gate lines to be turned on or off. In this case, it is necessary to provide a large amount of thin film transistors on the array substrate; therefore, the gate drive circuit will occupy a large area, which goes against the achievement of narrow border. In order to achieve narrow border, a double-sided driving solution can be utilized, that is, a driving signal is inputted simultaneously to the gate line at both ends of the gate line; however, in this case, problems of high temperature jitter and interlaced displaying may occur. In addition, due to a large area occupied by the gate drive circuit, wiring space for a protection circuit is limited, which may result in poor anti-electro-static discharge (anti-ESD) capability of the circuit.

SUMMARY

The present disclosure provides a shift register unit and a method for driving the shift register unit, a gate drive circuit and a display device, with which area occupied by the gate drive circuit can be reduced.

In one aspect, a shift register unit is provided in the present disclosure, which includes a driving signal generating module and a selecting module, in which: the driving signal generating module is configured to generate a driving signal for driving n rows of gate lines to be turned on, where a duration of the driving signal is equal to a duration spent on scanning the n rows of gate lines, and n is equal to or greater than 2; and the selecting module is connected to the driving signal generating module and input terminals of the n rows of gate lines, and is configured to select the n rows of gate lines sequentially and connect each selected row of gate line to the driving signal generating module, such that the driving signal generated by the driving signal generating module is inputted to the n rows of gate lines sequentially.

Optionally, the selecting module includes n thin film transistors and n clock signal terminals, and each of the n thin film transistors has a control electrode connected to one of the n clock signal terminals, a source electrode connected to an output terminal of the driving signal generating module, and a drain electrode connected to the input terminal of one of the n rows of gate lines.

Optionally, the n clock signal terminals are configured to input clock signals to the control electrodes of the n thin film transistors respectively, such that the n thin film transistors are turned on sequentially in the duration of the driving signal.

Optionally, the n thin film transistors of the selecting module are active with high levels, the n clock signal terminals output high levels sequentially in the duration of the driving signal, and there is only one clock signal terminal that outputs a high level at any time instant in the duration of the driving signal.

Optionally, the shift register unit further includes a noise reduction module, which is configured to reduce a noise of the driving signal inputted to the gate lines.

Optionally, the noise reduction module includes n−1 noise reduction units, which are arranged in a one-to-one correspondence with latterly turned-on n−1 rows of gate lines among the n rows of gate lines; and each of the n−1 noise reduction units is configured to, when the gate line corresponding to the noise reduction unit is turned on, connect an input terminal of each gate line that has been turned on before the gate line corresponding to the noise reduction unit to a low voltage terminal.

Optionally, the noise reduction unit corresponding to an m-th row of gate line among the n rows of gate lines includes m−1 thin film transistors, wherein m is equal to or greater than 2, and is equal to or smaller than n. Each of the m−1 thin film transistors has a control electrode connected to the input terminal of the m-th row of gate line and a source electrode connected to a low voltage terminal, and drain electrodes of the m−1 thin film transistors are connected to the input terminals of a first row to an (m−1)-th row of gate lines in a one-to-one correspondence.

Optionally, n may be equal to 2.

Optionally, the driving signal generating module includes a first transistor, a second transistor, a third transistor, a fourth transistor, a fifth transistor, a sixth transistor, a seventh transistor, an eighth transistor, a ninth transistor and a tenth transistor, a signal input terminal, a signal output terminal, a first high voltage terminal, a second high voltage terminal, a reset signal terminal, a first low voltage terminal, a second low voltage terminal, a pull-up node, a pull-down node, a first clock signal terminal and a first capacitor. A control electrode of the first transistor is connected to the signal input terminal, a source electrode of the first transistor is connected to the first high voltage terminal, and a drain electrode of the first transistor is connected to the pull-up node. A control electrode of the second transistor is connected to the reset signal terminal, a source electrode of the second transistor is connected to the first low voltage terminal, and a drain electrode of the second transistor is connected to the pull-up node. A control electrode of the third transistor is connected to the pull-up node, a source electrode of the third transistor is connected to the first clock signal terminal, and a drain electrode of the third transistor is connected to the output terminal. A control electrode and a source electrode of the fourth transistor are connected to the second high voltage terminal, and a drain electrode of the fourth transistor is connected to a control electrode of the fifth transistor. A source electrode of the fifth transistor is connected to the second high voltage terminal, and a drain electrode of the fifth transistor is connected to the pull-down node. A control electrode of the sixth transistor is connected to the pull-up node, a source electrode of the sixth transistor is connected to the second low voltage terminal, and a drain electrode of the sixth transistor is connected to the pull-down node. A control electrode of the seventh transistor is connected to the first low voltage terminal, a source electrode of the seventh transistor is connected to the second low voltage terminal, and a drain electrode of the seventh transistor is connected to the output terminal. A control electrode of the eighth transistor is connected to the pull-up node, a source electrode of the eighth transistor is connected to the second low voltage terminal, and a drain electrode of the eighth transistor is connected to the drain electrode of the fourth transistor and the control electrode of the fifth transistor. A control electrode of the ninth transistor is connected to the pull-down node, a source electrode of the ninth transistor is connected to the second low voltage terminal, and a drain electrode of the ninth transistor is connected to the pull-up node. A control electrode of the tenth transistor is connected to the pull-down node, a source electrode of the tenth transistor is connected to the second low voltage terminal, and a drain electrode of the tenth transistor is connected to the output. A first terminal of the first capacitor is connected to the pull-up node, and a second terminal of the first capacitor is connected to the drain electrode of the third transistor.

In another aspect, a method for driving the shift register unit described above is further provided in the present disclosure, which includes: generating a driving signal, where a duration of the driving signal is equal to a duration spent on scanning n rows of gate lines, and n is equal to or greater than 2; and inputting the driving signal to the n rows of gate lines sequentially.

In another aspect, a gate drive circuit is further provided in the present disclosure, and the gate drive circuit includes multiple shift register units described above, which are cascaded.

Optionally, the multiple shift register units are arranged at an identical side of the gate lines.

Optionally, the multiple shift register units are arranged at two opposite sides of the gate lines.

In other aspect, a display device is further provided in the present disclosure, which includes the gate drive circuit described above.

In the shift register unit provided in the present disclosure, the driving signal inputted into n rows of gate lines is generated by one driving signal generating module, compared with the related technologies, the quantity of the driving signal generating module is reduced; since each driving signal generating module often includes multiple components such as transistors and capacitors, the area occupied by a gate drive circuit can be reduced, thereby achieving narrow border, larger effective display region, and improved screen ratio. Further, enough space is provided for a protection circuit, and anti-ESD capability of the circuit is improved.

In the method for driving the shift register unit provided in the present disclosure, the generated driving signal is sequentially inputted to the n rows of gate lines, compared with the related technologies, the quantity of the driving signal generating module is reduced; since each driving signal generating module often includes multiple components such as transistors and capacitors, the area occupied by a gate drive circuit can be reduced, thereby achieving narrow border, larger effective display region, and improved screen ratio. Further, enough space is provided for a protection circuit, and anti-ESD capability of the circuit is improved.

In the gate drive circuit provided in the present disclosure, since the gate drive circuit includes the shift register unit provided in the present disclosure, the area occupied by the gate drive circuit can be reduced, thereby achieving narrow border, larger effective display region, and improved screen ratio. Further, enough space is provided for a protection circuit, and anti-ESD capability of the circuit is improved.

In the display device provided in the present disclosure, since the display device includes the gate drive circuit provided in the present disclosure, the area occupied by the gate drive circuit can be reduced, thereby achieving narrow border, larger effective display region, and improved screen ratio. Further, enough space is provided for a protection circuit, and anti-ESD capability of the circuit is improved.

BRIEF DESCRIPTION OF THE DRAWINGS

The drawings are provided for better understanding the present disclosure, which are used to explain the present disclosure in conjunction with embodiments below, however, is the drawings are not intended to limit the present disclosure.

Figure 1:
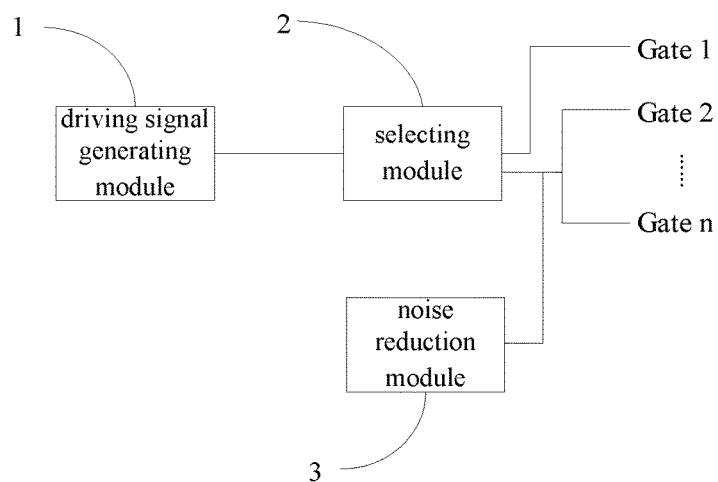
FIG. 1 is a schematic diagram of a shift register unit according to an embodiment of the present disclosure.

Specifically, reference numerals are explained as follows:

1: driving signal generating module; 2: selecting module; 3: noise reduction module; 30: noise reduction unit;

M1: first transistor; M2: second transistor; M3: third transistor; M4: fourth transistor; M5: fifth transistor; M6: sixth transistor; M7: seventh transistor; M8: eighth transistor; M9: ninth transistor: M10: tenth transistor; M11: eleventh transistor; M12: twelfth transistor; M13: thirteenth transistor; M14: fourteenth transistor; M15: fifteenth transistor; M16: sixteenth transistor; C1: first capacitor;

INPUT: signal input terminal; Reset: reset signal terminal; CLK1: first clock signal terminal; CLK2: second clock signal terminal; CLK3: third clock signal terminal; VDD: first high voltage terminal; VSS: first low voltage terminal; VGH: second high voltage terminal; VGL: second low voltage terminal/low voltage terminal; OUTPUT: output terminal;

Gate 1: first row of gate line among n rows of gate lines; Gate2: second row of gate line among n rows of gate lines; Gate3: third row of gate line among n rows of gate lines.

DETAILED DESCRIPTION

Embodiments of the present disclosure will be explained hereinafter in detail in conjunction drawings. It should be understood that, the embodiments herein are only used to illustrate and explain the present disclosure, and are not intended to limit the present disclosure.

A shift register unit is provided in the present disclosure. A schematic diagram of a shift register unit according to an embodiment of the present disclosure is shown in FIG. 1. As shown in FIG. 1, in the embodiment, the shift register unit includes a driving signal generating module 1 and a selecting module 2. The driving signal generating module 1 is configured to generate a driving signal for driving gate lines to be turned on, where a duration of the driving signal is equal to a duration spent on scanning n rows of gate lines, and n is equal to or greater than 2. The selecting module 2 is connected to input terminals of the n rows of gate lines, and is configured to select the n rows of gate lines sequentially and connect each selected row of gate line to the driving signal generating module, such that the driving signal generated by the driving signal generating module is inputted to the n rows of gate lines sequentially.

Assuming that for one frame of image, each row of gate line is in on-state for a period of t; in this case, a duration of the driving signal generated by the driving signal generating module 1 is n×t. During the period of n×t, the selecting module 2 selects the n rows of gate lines sequentially and connects of the selected row of gate line to the driving signal generating module 1, such that the driving signal generated by the driving signal generating module is inputted to the n rows of gate lines sequentially and the n rows of the gate lines are driven sequentially to be turned on.

As described above, in the embodiment, the driving signal inputted into n rows of gate lines is generated by one driving signal generating module 1, compared with the related technologies, the quantity of the driving signal generating module 1 in the gate drive circuit is reduced. Since each driving signal generating module 1 often includes multiple components such as TFTs and capacitors, the area occupied by the gate drive circuit can be reduced, thereby achieving a display device of narrow border, larger effective display region, and improved screen ratio; further, enough space is provided for arrangement of a protection circuit, and the anti-ESD capability of the circuit is improved.

Specifically, in an embodiment, narrow border can be achieved on basis of a single-sided driving manner, compared with technical solutions in related technologies in which narrow border is achieved through a double-sided driving manner, problems of high temperature jitter and interlaced displaying can be alleviated. Moreover, in the present disclosure, the double-sided driving manner may be used to further reduce border width and achieve narrower border.

In an embodiment, the selecting module 2 may include n TFTs, each TFT has a control electrode connected to one clock signal terminal, a source electrode connected to an output terminal of the driving signal generating module 1, and a drain electrode connected to an input terminal of one row of gate line. Specifically, each clock signal terminal inputs a clock signal to the control electrode of the TFT connected to the clock signal terminal, the clock signal controls the TFT to be turned on or off, and the output terminal of the driving signal generating module 1 is connected to the gate line connected to the drain electrode of the TFT when the TFT is turned on, thus, a driving signal generated by the driving signal generating module 1 is inputted to the gate line.

Hereinafter, taking n=2 for an example, operation principle and procedure of the shift register unit provided in the embodiment will be described in detail in conjunction with FIG. 2.

Figure 2:
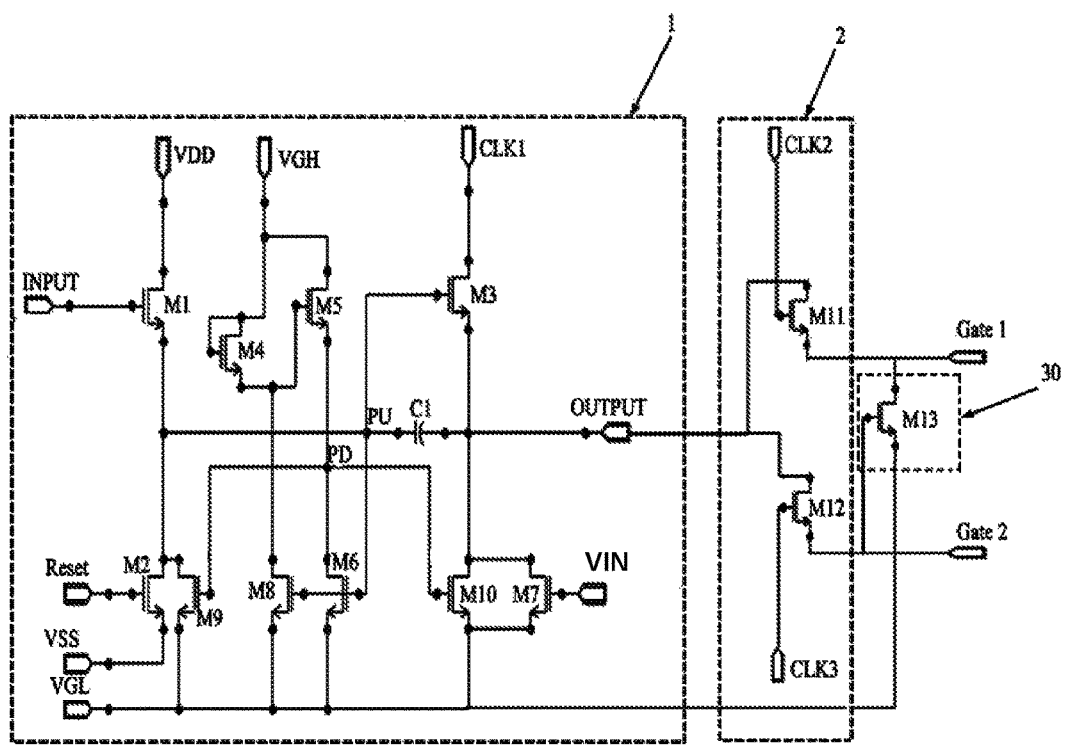
FIG. 2 is a circuit diagram of the shift register unit in FIG. 1.

In the case that n=2, as shown in FIG. 2, the selecting module 2 is connected to two rows of gate lines, i.e., a first row of gate line Gate1 and a second row of gate line Gate2. The selecting module 2 includes an eleventh transistor M11 and a twelfth transistor M12; a control electrode of the eleventh transistor M11 is connected to a second clock signal terminal CLK2, a source electrode of the eleventh transistor M11 is connected to an output terminal OUTPUT of the driving signal generating module 1, and a drain electrode of the eleventh transistor M11 is connected to an input terminal of the gate line Gate1; a control electrode of the twelfth transistor M12 is connected to a third clock signal terminal CLK3, a source electrode of the twelfth transistor M12 is connected to the output terminal OUTPUT of the driving signal generating module 1, and a drain electrode of the twelfth transistor M12 is connected to an input terminal of the gate line Gate2.

Figure 3:
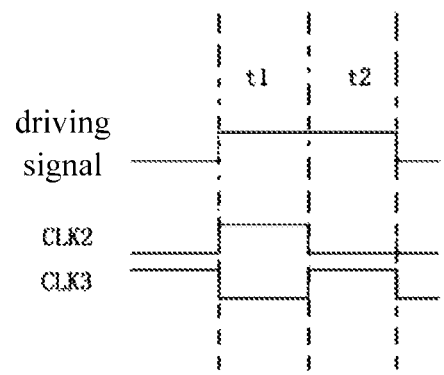
FIG. 3 is a sequence diagram of respective signals of the circuit in FIG. 2.

When the driving signal generating module 1 provides the driving signal, as shown in FIG. 3, during a first stage t1, the second clock signal terminal CLK2 outputs a high level, the third clock signal terminal CLK3 outputs a low level. In this case, the eleventh transistor M11 is turned on, and the twelfth transistor M12 is turned off, such that the driving signal generating module 1 is connected to the gate line Gate1, the gate line Gate2 is disconnected with the driving signal generating module 1; therefore, the driving signal is inputted to the gate line Gate1 during the first stage t1. During a second stage t2, the second clock signal terminal CLK2 outputs a low level, the third clock signal terminal CLK3 outputs a high level. In this case, the eleventh transistor M11 is turned off, and the twelfth transistor M12 is turned on, such that the driving signal generating module 1 is connected to the gate line Gate2, the gate line Gate1 is disconnected with the driving signal generating module 1; therefore, the driving signal is inputted to the gate line Gate2 during the second stage t2. As can be known from the foregoing, the gate lines Gate1 and Gate2 are driven to be turned on through the driving signal sequentially.

The shift register unit may further include a noise reduction module 3, which is configured to reduce a noise of the driving signal inputted to the gate lines to improve display quality. Specifically, the noise reduction module 3 includes n−1 noise reduction units 30, which are arranged in a one-to-one correspondence with latterly turned-on n−1 rows of gate lines in the n rows of gate lines; and each of the n−1 noise reduction units is configured to, when the gate line corresponding to the noise reduction unit is turned on, connect an input terminal of each gate line which has been turned on before the gate line corresponding to the noise reduction unit to a low voltage terminal. Generally, a noise signal is generated when a formerly turned-on gate line is turned off and such noise signal interferes with the driving signal inputted to a gate line that is turned on latterly. In the embodiment, when the driving signal is inputted to a latterly turned-on gate line, a noise reduction unit 30 corresponding to the latterly turned-on gate line may connect each gate line that has been turned on before the latterly turned-on gate line to a low voltage terminal; therefore, noise generated by each formerly turned-on gate line is reduced, the driving signal inputted to the gate line corresponding to the noise reduction unit 30 is more accurate, and the display quality is improved.

Further, a noise reduction unit corresponding to an m-th row of gate line among the n rows of gate lines includes m−1 TFTs, where the m is equal to or greater than 2, and is equal to or smaller than n. Each of the m−1 TFTs has a control electrode connected to an input terminal of the m-th row of gate line and a source electrode connected to a low voltage terminal, and drain electrodes of the m−1 TFTs are connected to input terminals of a first row to an (m−1)-th row of gate lines in a one-to-one correspondence.

Taking a shift register unit shown in FIG. 2, where n=2, as an example, the noise reduction module 3 includes a noise reduction unit 30 corresponding to the gate line Gate2. The noise reduction unit 30 includes a thirteenth transistor M13 having a control electrode connected to an input terminal of the gate line Gate2, a source electrode connected to a low voltage terminal VGL (in the embodiment, VGL is a second low voltage terminal), and a drain electrode connected to an input terminal of the gate line Gate1. The driving signal inputted to the gate line Gate2 drives the thirteenth transistor M13 to be turned on, such that the gate line Gate1 is connected to the low voltage terminal VGL; therefore, a noise signal in the gate line Gate1 is reduced and causes less interference on the driving signal inputted to the gate line Gate2.

Figure 4:
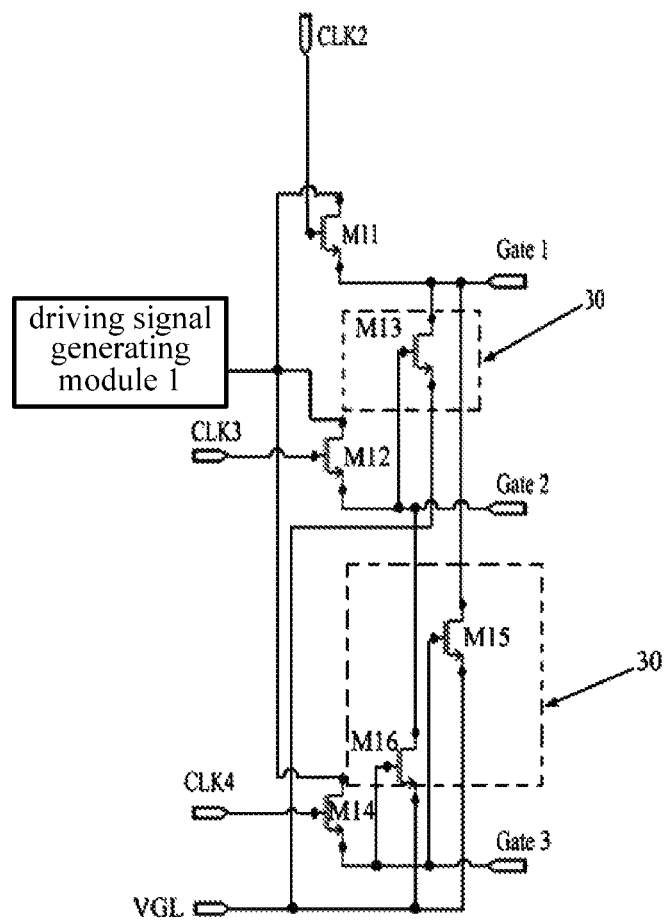
FIG. 4 is a circuit diagram of a selecting module and a noise reduction module in the case that n is equal to 3.

A circuit structure of a noise reduction module 3 is shown in FIG. 4, where n=3. As shown in FIG. 4, in the case of n=3, the selecting module 2 is connected to three rows of gate lines, i.e., Gate1, Gate2 and Gate3. The selecting module 2 includes three transistors, i.e., an eleventh transistor M11, a twelfth transistor M12 and a fourteenth transistor M14 that are respectively connected to the gate lines Gate1, the Gate2 and the Gate3 through their drain electrodes. The noise reduction module 3 includes two noise reduction units 30 corresponding to the gate lines Gate2 and the Gate3 respectively. The noise reduction unit 30 corresponding to the gate line Gate2 includes a thirteenth transistor M13, which has a control electrode connected to an input terminal of the gate line Gate2, a source electrode connected to a low voltage terminal VGL, and a drain electrode connected to the gate line Gate1. A driving signal inputted to the gate line Gate2 drives the thirteenth transistor M13 to be turned on, such that the gate line Gate1 is connected to the low voltage terminal VGL; therefore, a noise signal in the gate line Gate1 is reduced and causes less interference on the driving signal inputted to the gate line Gate2. The noise reduction unit 30 corresponding to the gate line Gate3 includes a fifteenth transistor M15 and a sixteenth transistor M16. The fifteenth transistor M15 has a control electrode connected to the gate line Gate3, a source electrode connected to the low voltage terminal VGL, and a drain electrode connected to the gate line Gate1. The sixteenth transistor M16 has a control electrode connected to the gate line Gate3, a source electrode connected to the low voltage terminal VGL, and a drain electrode connected to the gate line Gate2. A driving signal inputted to the gate line Gate3 drives the fifteenth transistor M15 and the sixteenth transistor M16 to be turned on, such that the gate line Gate1 and the gate line Gate2 are connected to the low voltage terminal VGL; therefore, noise signals in the gate line Gate1 and the gate line Gate2 are reduced and cause less interference on the driving signal inputted to the gate line Gate3.

The structures of the noise reduction module 3 are described in detail above by taking n=2 and n=3 for examples. When n is greater than 3, the noise reduction module 3 has a similar structure as those described above, and the structure when n is greater than 3 is not detailed herein.

As can be seen from the foregoing, when n=2, each of the selecting module 2 and the noise reduction module 3 has a simplest structure; thus, in practical application, it is preferred to set n as 2, such that a gate drive circuit has a simpler circuit structure.

The driving signal generating module 1 may have a structure as shown in FIG. 2, specifically, the driving signal generating module 1 includes a first transistor M1 to a tenth transistor M10, a signal input INPUT, a signal output OUTPUT, a first high voltage terminal VDD, a second high voltage terminal VGH, a reset signal terminal Reset, a first low voltage terminal VSS, a second low voltage terminal VGL, a pull-up node PU, a pull-down node PD, a first clock signal terminal CLK1 and a first capacitor C1. A control electrode of the first transistor M1 is connected to the signal input terminal INPUT, a source electrode of the first transistor M1 is connected to the first high voltage terminal VDD, and a drain electrode of the first transistor M1 is connected to the pull-up node PU. A control electrode of a second transistor M2 is connected to the reset signal terminal Reset, a source electrode of the second transistor M2 is connected to the first low voltage terminal VSS, and a drain electrode of the second transistor M2 is connected to the pull-up node PU. A control electrode of a third transistor M3 is connected to the pull-up node PU, a source electrode of the third transistor M3 is connected to the first clock signal terminal CLK1, and a drain electrode of the third transistor M3 is connected to the output terminal OUTPUT. A control electrode and a source electrode of a fourth transistor M4 are connected to the second high voltage terminal VGH, and a drain electrode of the fourth transistor M4 is connected to a control electrode of a fifth transistor M5. A source electrode of the fifth transistor M5 is connected to the second high voltage terminal VGH, and a drain electrode of the fifth transistor M5 is connected to the pull-down node PD. A control electrode of a sixth transistor M6 is connected to the pull-up node PU, a source electrode of the sixth transistor M6 is connected to the second low voltage terminal VGL, and a drain electrode of the sixth transistor M6 is connected to the pull-down node PD. A control electrode of a seventh transistor M7 is connected to a first voltage terminal VIN to which a first low voltage and a first high voltage are applied in a time-division manner, a source electrode of the seventh transistor M7 is connected to the second low voltage terminal VGL, and a drain electrode of the seventh transistor is connected to the output terminal OUTPUT. A control electrode of an eighth transistor M8 is connected to the pull-up node PU, a source electrode of the eighth transistor M8 is connected to the second low voltage terminal VGL, and a drain electrode of the eighth transistor is connected to the drain electrode of the fourth transistor M4 and the control electrode of the fifth transistor M5. A control electrode of a ninth transistor M9 is connected to the pull-down node PD, a source electrode of the ninth transistor M9 is connected to the second low voltage terminal VGL, and a drain electrode of the ninth transistor is connected to the pull-up node PU. A control electrode of the tenth transistor M10 is connected to the pull-down node PU, a source electrode of the tenth transistor M10 is connected to the second low voltage terminal VGL, and a drain electrode of the tenth transistor M10 is connected to the output terminal OUTPUT. A first terminal of the first capacitor C1 is connected to the pull-up node PU, and a second terminal of the first capacitor C1 is connected to the drain electrode of the third transistor M3.

It should be noted herein that, other than the structure including the ten transistors and the capacitor shown in FIG. 2, the driving signal generating module 1 may have any other circuit structure which can generate a driving signal.

In summary, in the shift register unit provided in the embodiment of the present disclosure, the driving signal inputted into n rows of gate lines is generated by one driving signal generating module 1, compared with the related technologies, the quantity of the driving signal generating module 1 is reduced. Since each driving signal generating module 1 often includes multiple components such as transistors and capacitors, the area occupied by a gate drive circuit can be reduced, thereby achieving narrow border, larger effective display region, and improved screen ratio. Further, enough space is provided for a protection circuit, and the anti-ESD capability of the circuit is improved.

Figure 5:
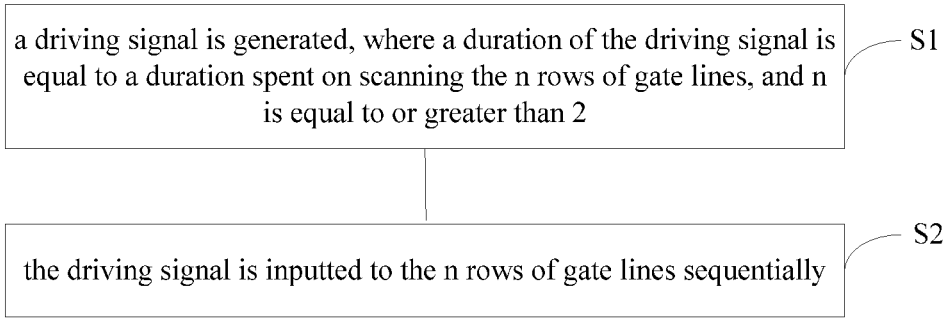
FIG. 5 is a flow chart of a method for driving a shift register unit according to an embodiment of the present disclosure.

A method for driving the shift register unit described above is further provided in an embodiment of the present disclosure. In the embodiment, as shown in FIG. 5, the method includes steps S1 and S2.

In step S1, a driving signal is generated, where a duration of the driving signal is equal to a duration spent on scanning n rows of gate lines, n is equal to or greater than 2.

In step S2, the driving signal is inputted to the n rows of gate lines sequentially.

In the method for driving the shift register unit provided in the embodiment of the present disclosure, the generated driving signal is inputted to the n rows of gate lines sequentially, compared with the related technologies, the quantity of a driving signal generating module for generating the driving signal is reduced. Since each driving signal generating module often includes multiple components such as transistors and capacitors, the area occupied by a gate drive circuit can be reduced, thereby achieving narrow border, larger effective display region, and improved screen ratio. Further, enough space is provided for a protection circuit, and the anti-ESD capability of the circuit is improved.

A gate drive circuit is further provided according to an embodiment of the present disclosure. In the embodiment, the gate drive circuit includes multiple shift register units according to the foregoing embodiment, which are cascaded.

Since the gate drive circuit includes the shift register unit provided in the foregoing embodiment, the area occupied by the gate drive circuit can be reduced, thereby achieving narrow border, larger effective display region, and improved screen ratio. Further, enough space is provided for a protection circuit, and the anti-ESD capability of the circuit is improved.

A display device is further provided according to an embodiment of the present disclosure. In the embodiment, the display device includes the gate drive circuit according to the foregoing embodiment.

Since the display device includes the gate drive circuit provided in the foregoing embodiment, the area occupied by the gate drive circuit can be reduced, thereby achieving narrow border, larger effective display region, and improved screen ratio. Further, enough space is provided to for a protection circuit, and the anti-ESD capability of the circuit is improved.

It should be understood that, the above embodiments are only the exemplary embodiments used to explain the principle of the present disclosure, and the present disclosure is not limited thereto. For the skilled in the art, improvements and modifications may be made without departing from the spirit and essential characteristics of the present disclosure, and those improvements and modifications should also be included in the scope of protection of the present disclosure.

What is claimed is:

1. A shift register unit, comprising:
   a driving signal generating module, configured to generate a driving signal for driving n rows of gate lines to be turned on, wherein a duration of the driving signal is equal to a duration spent on scanning the n rows of gate lines;
   a selecting module, connected to the driving signal generating module and input terminals of the n rows of gate lines, and configured to select the n rows of gate lines sequentially and connect each selected row of gate line to the driving signal generating module, such that the driving signal generated by the driving signal generating module is inputted to the n rows of gate lines sequentially; and
   a noise reduction module, configured to reduce a noise of the driving signal inputted to the gate lines;
   wherein the noise reduction module comprises n−1 noise reduction units, which are arranged in a one-to-one correspondence with latterly turned-on n−1 rows of gate lines among the n rows of gate lines;
   wherein each of the n−1 noise reduction units is configured to, when the gate line corresponding to the noise reduction unit is turned on, connect an input terminal of each gate line that has been turned on before the gate line corresponding to the noise reduction unit to a low voltage terminal;
   wherein the noise reduction unit corresponding to an m-th row of gate line among the n rows of gate lines comprises m−1 thin film transistors;
   wherein each of the m−1 thin film transistors has a control electrode connected to the input terminal of the m-th row of gate line and a source electrode connected to a low voltage terminal, and drain electrodes of the m−1 thin film transistors are connected to the input terminals of a first row to an (m−1)-th row of gate lines in a one-to-one correspondence; and
   wherein n is greater than or equal to 3, and m takes each integer value in a range between 2 to n, inclusively.

2. The shift register unit according to claim 1, wherein the selecting module comprises n thin film transistors and n clock signal terminals, and each of the n thin film transistors has a control electrode connected to one of the n clock signal terminals, a source electrode connected to an output terminal of the driving signal generating module, and a drain electrode connected to the input terminal of one of the n rows of gate lines.

3. The shift register unit according to claim 2, wherein the n clock signal terminals are configured to input clock signals to the control electrodes of the n thin film transistors respectively, such that the n thin film transistors are turned on sequentially in the duration of the driving signal.

4. The shift register unit according to claim 3, wherein the n thin film transistors of the selecting module are active with high levels, the n clock signal terminals output high levels sequentially in the duration of the driving signal, and there is only one clock signal terminal that outputs a high level at any time instant in the duration of the driving signal.

5. The shift register unit according to claim 1, wherein n is equal to 3.

6. The shift register unit according to claim 1, wherein the driving signal generating module comprises a first transistor, a second transistor, a third transistor, a fourth transistor, a fifth transistor, a sixth transistor, a seventh transistor, an eighth transistor, a ninth transistor and a tenth transistor, a signal input terminal, a signal output terminal, a first high voltage terminal, a second high voltage terminal, a reset signal terminal, a first low voltage terminal, a second low voltage terminal, a pull-up node, a pull-down node, a first clock signal terminal and a first capacitor; wherein
   a control electrode of the first transistor is connected to the signal input terminal, a source electrode of the first transistor is connected to the first high voltage terminal, and a drain electrode of the first transistor is connected to the pull-up node;

a control electrode of the second transistor is connected to the reset signal terminal, a source electrode of the second transistor is connected to the first low voltage terminal, and a drain electrode of the second transistor is connected to the pull-up node;

a control electrode of the third transistor is connected to the pull-up node, a source electrode of the third transistor is connected to the first clock signal terminal, and a drain electrode of the third transistor is connected to the output terminal;

a control electrode and a source electrode of the fourth transistor are connected to the second high voltage terminal, and a drain electrode of the fourth transistor is connected to a control electrode of the fifth transistor;

a source electrode of the fifth transistor is connected to the second high voltage terminal, and a drain electrode of the fifth transistor is connected to the pull-down node;

a control electrode of the sixth transistor is connected to the pull-up node, a source electrode of the sixth transistor is connected to the second low voltage terminal, and a drain electrode of the sixth transistor is connected to the pull-down node;

a control electrode of the seventh transistor is connected to a first voltage terminal to which a first low voltage and a first high voltage are applied in a time-division manner, a source electrode of the seventh transistor is connected to the second low voltage terminal, and a drain electrode of the seventh transistor is connected to the output terminal;

a control electrode of the eighth transistor is connected to the pull-up node, a source electrode of the eighth transistor is connected to the second low voltage terminal, and a drain electrode of the eighth transistor is connected to the drain electrode of the fourth transistor and the control electrode of the fifth transistor;

a control electrode of the ninth transistor is connected to the pull-down node, a source electrode of the ninth transistor is connected to the second low voltage terminal, and a drain electrode of the ninth transistor is connected to the pull-up node;

a control electrode of the tenth transistor is connected to the pull-down node, a source electrode of the tenth transistor is connected to the second low voltage terminal, and a drain electrode of the tenth transistor is connected to the output; and a first terminal of the first capacitor is connected to the pull-up node, and a second terminal of the first capacitor is connected to the drain electrode of the third transistor.

7. A method for driving a shift register unit, wherein the shift register unit comprises:

a driving signal generating module, configured to generate a driving signal for driving n rows of gate lines to be turned on, wherein a duration of the driving signal is equal to a duration spent on scanning the n rows of gate lines;

a selecting module, connected to the driving signal generating module and input terminals of the n rows of gate lines, and configured to select the n rows of gate lines sequentially and connect each selected row of gate line to the driving signal generating module, such that the driving signal generated by the driving signal generating module is inputted to the n rows of gate lines sequentially; and a noise reduction module, configured to reduce a noise of the driving signal inputted to the gate lines;

wherein the noise reduction module comprises n−1 noise reduction units, which are arranged in a one-to-one correspondence with latterly turned-on n−1 rows of gate lines among the n rows of gate lines;

wherein each of the n−1 noise reduction units is configured to, when the gate line corresponding to the noise reduction unit is turned on, connect an input terminal of each gate line that has been turned on before the gate line corresponding to the noise reduction unit to a low voltage terminal;

wherein the noise reduction unit corresponding to an m-th row of gate line among the n rows of gate lines comprises m−1 thin film transistors;

wherein each of the m−1 thin film transistors has a control electrode connected to the input terminal of the m-th row of gate line and a source electrode connected to a low voltage terminal, and drain electrodes of the m−1 thin film transistors are connected to the input terminals of a first row to an (m−1)-th row of gate lines in a one-to-one correspondence;

wherein n is greater than or equal to 3, and m takes each integer value in a range between 2 to n, inclusively;

wherein the method comprises:

generating the driving signal; and inputting the driving signal to the n rows of gate lines sequentially.

8. A gate drive circuit, comprising a plurality of shift register units that are cascaded, wherein each of the plurality of shift register units comprises:

a driving signal generating module, configured to generate a driving signal for driving n rows of gate lines to be turned on, wherein a duration of the driving signal is equal to a duration spent on scanning the n rows of gate lines;

a selecting module, connected to the driving signal generating module and input terminals of the n rows of gate lines, and configured to select the n rows of gate lines sequentially and connect each selected row of gate line to the driving signal generating module, such that the driving signal generated by the driving signal generating module is inputted to the n rows of gate lines sequentially; and a noise reduction module, configured to reduce a noise of the driving signal inputted to the gate lines;

wherein the noise reduction module comprises n−1 noise reduction units, which are arranged in a one-to-one correspondence with latterly turned-on n−1 rows of gate lines among the n rows of gate lines;

wherein each of the n−1 noise reduction units is configured to, when the gate line corresponding to the noise reduction unit is turned on, connect an input terminal of each gate line that has been turned on before the gate line corresponding to the noise reduction unit to a low voltage terminal;

wherein the noise reduction unit corresponding to an m-th row of gate line among the n rows of gate lines comprises m−1 thin film transistors;

wherein each of the m−1 thin film transistors has a control electrode connected to the input terminal of the m-th row of gate line and a source electrode connected to a low voltage terminal, and drain electrodes of the m−1 thin film transistors are connected to the input terminals of a first row to an (m−1)-th row of gate lines in a one-to-one correspondence; and wherein n is greater than or equal to 3, and m takes each integer value in a range between 2 to n, inclusively.

9. The gate drive circuit according to claim 8, wherein the plurality of shift register units is arranged at an identical side of the gate lines.

10. The gate drive circuit according to claim 8, wherein the plurality of shift register units is arranged at two opposite sides of the gate lines.

11. A display device, comprising the gate drive circuit according to claim 8.

* * * * *